United States Patent
Isobe et al.

(10) Patent No.: US 6,346,761 B1
(45) Date of Patent: Feb. 12, 2002

(54) SURFACE ACOUSTIC WAVE DEVICE CAPABLE OF SUPPRESSING SPURIOUS RESPONSE DUE TO NON-HARMONIC HIGHER-ORDER MODES

(75) Inventors: Atsushi Isobe, Kodaira; Mitsutaka Hikita; Kengo Asai, both of Hachioji; Atsushi Sumioka, Kokubunji, all of (JP)

(73) Assignee: Hitachi Denshi Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/492,078

(22) Filed: Jan. 27, 2000

(30) Foreign Application Priority Data

Jan. 27, 1999 (JP) .......................................... 11-018909

(51) Int. Cl.[7] .............................................. H01L 41/04
(52) U.S. Cl. ..................................... 310/313 B; 310/365
(58) Field of Search ........................ 310/313 B, 313 R; 333/151, 194

(56) References Cited

U.S. PATENT DOCUMENTS

| | | | | |
|---|---|---|---|---|
| 3,919,669 A | * | 11/1975 | Hartemann | 333/154 |
| 4,049,982 A | * | 9/1977 | Cohen | 310/313 B |
| 4,406,964 A | * | 9/1983 | Chiba et al. | 310/313 B |
| 4,453,242 A | * | 6/1984 | Toda | 369/132 |
| 4,504,759 A | * | 3/1985 | Schofield | 310/313 C |
| 4,511,866 A | * | 4/1985 | Milsom | 333/194 |
| 4,707,631 A | * | 11/1987 | Stokes et al. | 310/313 A |
| 5,084,646 A | * | 1/1992 | Noel et al. | 310/313 C |
| 5,142,185 A | * | 8/1992 | Noel et al. | 310/313 B |
| 5,179,309 A | * | 1/1993 | Stokes et al. | 310/313 B |
| 5,189,330 A | * | 2/1993 | Niitsuma | 310/313 B |
| 5,471,179 A | * | 11/1995 | Koshkin et al. | 333/195 |
| 5,477,098 A | * | 12/1995 | Eguchi et al. | 310/313 R |
| 5,717,274 A | * | 2/1998 | Eguchi et al. | 310/313 R |
| 5,760,525 A | * | 6/1998 | Hachisu et al. | 310/313 B |

FOREIGN PATENT DOCUMENTS

| | | | |
|---|---|---|---|
| GB | 2 145 596 | * | 3/1985 |
| JP | 59-200519 | * | 11/1984 |
| JP | A-6-85602 | | 3/1994 |
| JP | 07-240658 | * | 9/1995 |

OTHER PUBLICATIONS

"Small–Size Love–Type SAW Resonator with Very Low Capacitance Ratio", Hiroshi Shimizu etc., Transactions of the Institute of Electronics, Information and Communication Engineers A, vol. J.75–A, No. 3, pp 458–466, Mar. 1992.

* cited by examiner

Primary Examiner—Nestor Ramirez
Assistant Examiner—Peter Medley
(74) Attorney, Agent, or Firm—Antonelli, Terry, Stout & Kraus, LLP

(57) ABSTRACT

A surface acoustic wave device which includes a piezoelectric substrate, and an interdigital transducer formed on a planar surface of the piezoelectric substrate, and having first and second bus bars, a first plurality of electrode fingers connected to the first bus bar, and a second plurality of electrode fingers connected to the second bus bar. The first and second plurality of electrode fingers of the interdigital transducer have an electrode cross region in which the first and second plurality of electrode fingers are arranged alternatively. Each boundary between the first and second bus bars and a grating region of the first and second plurality of electrode fingers is arranged such that the boundary is not substantially parallel, with a transmission direction of surface acoustic waves excited by the interdigital transducer.

21 Claims, 6 Drawing Sheets

US 6,346,761 B1

SURFACE ACOUSTIC WAVE DEVICE CAPABLE OF SUPPRESSING SPURIOUS RESPONSE DUE TO NON-HARMONIC HIGHER-ORDER MODES

BACKGROUND OF THE INVENTION

The present invention relates generally to a surface acoustic wave (SAW) device, and more particularly to a SAW device for use in communication devices and so on, which defines a cross region of electrode fingers forming interdigital transducers (IDT), and a direction of surface acoustic wave propagation (group velocity).

SAW devices are widely used in such applications as resonators, reflectors, filters and so on as lightweight, small-size circuit elements for communication devices. The SAW devices may be classified into SAW devices which utilize Rayleigh waves, SAW devices which utilize Love waves, and so on. The SAW devices utilizing Love waves are known to have a larger electro-mechanical coupling coefficient ($k^2$) than the SAW devices utilizing Rayleigh waves.

A known Love-wave type SAW resonator (Love-wave type SAW device) has the structure illustrated in FIGS. 1 and 3. FIG. 1 is a top plan view illustrating the basic structure of electrodes which form part of the Love-wave type SAW resonator. An interdigital transducer composed of bus bars 2-1, 2-2, electrode fingers 3, and input/output terminals 4, 5 is formed on a surface of a piezoelectric substrate 1. In the SAW resonator of FIG. 1, an electrode cross region 8 is arranged in a grating region 9 such that the width W thereof is constant in a surface wave ropagation direction. The electrode fingers connected to the bus bar 2-1 and the electrode fingers connected to the bus bar 2-2 are arranged alternatively in the electrode cross region 8. Non-harmonic higher-order longitudinal and transversal mode oscillations exist in the surface wave propagation direction, i.e., the group velocity direction (the direction indicated by the arrow in FIG. 1) and in the direction perpendicular to the surface wave propagation direction, respectively. The impedance characteristic of the resonator as illustrated in FIG. 1 disadvantageously exhibits a spurious response (indicated by a wavy line 30 in FIG. 2) resulting from the existence of such oscillations (standing waves), as can be seen in a Smith chart of FIG. 2.

A SAW resonator employing an apodization technique, as illustrated in FIG. 3, has been proposed in order to suppress the spurious response due to the nonharmonic higher-order modes (for example, see JP-A-6-85602). Referring specifically to FIG. 3, the apodization technique distributes a cross region 8a of electrode fingers 3 in conformity to a function which defines a maximum cross width at the center of the cross region 8a, and reduces the cross width along the surface wave propagation direction (indicated by the arrow in FIG. 3) to substantially zero at paired electrode fingers located at both side ends of the cross region 8a. Thus, the spurious response can be suppressed by such a apodization-based arrangement (see, for example, JP-A-6-85602, or "Small-Size Love-Type SAW Resonator with Very Low Capacitance Ratio" by Hiroshi Shimizu and Yuji Suzuki, Transactions of the Institute of Electronics, Information and Communication Engineers A, Vol. j.75-A, No. 3, pp 458–466, March 1992).

A grating region 9a located outside the cross region 8a of the electrode fingers between bus bars 2-1, 2-2 also functions as a SAW waveguide. Conventionally, the influence of the SAW waveguide has hardly been taken into account. For this reason, the piezoelectric substrate and the electrode finger (grating) region 9 of electrodes have been in the shape of a rectangle, i.e., the same shape as the optical waveguide and electromagnetic wave waveguide.

SUMMARY OF THE INVENTION

The conventional SAW resonator which has been improved by the weighted cross region in accordance with the apodization technique, though it has achieved a large effect in suppressing the spurious response due to the non-harmonic higher-order modes, still fails to completely eliminate the spurious response due to the non-harmonic higher-order modes. If such a SAW resonator is used as an oscillating element for a highly accurate voltage controlled oscillator (VCO), the resulting voltage controlled oscillator suffers from skipping of the oscillating frequency caused by the spurious response due to the aforementioned non-harmonic higher-order longitudinal and transversal modes.

It is therefore an object of the present invention to realize a SAW device which is capable of further suppressing the spurious response due to the non-harmonic higher-order modes.

It is another object of the present invention to realize a SAW device which is capable of allowing for the ease of manufacturing and a reduction in size as well as achieving the above object.

To achieve the above objects, in one aspect of the present invention, a surface acoustic wave device having an interdigital transducer (IDT) formed on a piezoelectric substrate is structured such that in significant portions of boundaries between bus bars and a grating region, which is composed of electrode fingers of the IDT, the extending directions of the boundaries are oriented non-parallel with the propagation direction of acoustic surface waves.

In one aspect of the present invention, a surface acoustic wave device comprises a piezoelectric substrate, and an interdigital transducer formed on a planar surface of the piezoelectric substrate, and having first and second bus bars, a first plurality of electrode fingers connected to the first bus bar, and a second plurality of electrode fingers connected to the second bus bar, wherein the first and second plurality of electrode fingers of the interdigital transducer have an electrode cross region in which the first and second plurality of electrode fingers are arranged alternatively, and each of boundaries between the first and second bus bars and a grating region of the first and second plurality of electrode fingers is arranged such that the boundary is not substantially parallel, with a group velocity direction (transmission direction) of surface acoustic waves excited by the interdigital transducer.

In another aspect of the present invention, a surface acoustic wave device comprises a piezoelectric substrate, and an interdigital transducer formed on a planar surface of the piezoelectric substrate, and having first and second bus bars, a first plurality of electrode fingers connected to the first bus bar, and a second plurality of electrode fingers connected to the second bus bar, wherein the first and second plurality of electrode fingers of the interdigital transducer have an electrode cross region in which the first and second plurality of electrode fingers are arranged alternatively, and the distance between the first and second bus bars along the first and second plurality of electrode fingers varies along a group velocity direction of the surface acoustic waves excited by the interdigital transducer.

In one example of the present invention, each of the boundaries is arranged such that the extending direction of the boundary is at an angle in a range of 45±27 degrees, in a significant portion thereof, with respect to the group velocity direction of the surface modes because of the influence of distorted standing waves generated between opposing bus bars, which had not been taken into account in the prior art. Then, the inventors fabricated a variety of prototype SAW resonators, each of which had bus bars determined in shape and arrangement such that standing waves differed in frequency and phase with respect to the propagation direction of surface acoustic waves to prevent the standing waves from being generated between the bus bars, and verified the effects of these SAW resonators.

In the aforementioned conventional SAW resonator illustrated in FIG. 3, the grating region 9 has two regions. One of the two regions is the electrode cross region 8a in which the electrode fingers connected to the bus bar 2-1 and the electrode fingers connected to the bus bar 2-2 are arranged alternatively. The other of the two regions is the region 9a in which two kinds of these electrode fingers connected to the bus bars 2-1 and 2-2 are not arranged alternatively. The grating 9 is in the shape of a rectangle, where the long sides of the rectangle extend in parallel with the direction of surface acoustic wave propagation. Two boundaries between the grating region 9 and the bus bars 2-1, 2-2 function as reflecting surfaces for certain components of surface acoustic waves (components of the surface acoustic waves having a wave vector in the direction perpendicular to the propagation direction of the surface acoustic waves (the direction indicated by the arrow in FIG. 3), i.e., non-acoustic waves excited by the interdigital transducer.

In one example of the present invention, each of the boundaries is arranged such that the extending direction of the boundary is not parallel, in one half or more of the overall length thereof, with the group velocity direction of surface acoustic waves excited by the interdigital transducer.

According to one example of the present invention, the surface acoustic wave device has a cross region of the electrode fingers weighted with respect to the propagation (group velocity) direction of surface acoustic waves, wherein the piezoelectric substrate is in the shape of a rhomboid, and the bus bars are arranged along the outer periphery of the piezoelectric substrate in the shape of a rhomboid. Further, when the cross region of the weighted electrode fingers is in the shape of a rhomboid, the distance between each of envelopes of the cross region of the electrode fingers and corresponding one of the bus bars is made constant.

While the angle between each bus bar and the propagation direction of surface acoustic waves is most preferably chosen to be approximately 45 degrees, the angle may be in a range of approximately 18 to 72 degrees to effectively suppress the spurious response due to the non-harmonic higher-order modes.

The inventors of the present invention hypothesized that a weighted SAW device still suffered from the spurious due to the non-harmonic higher-order harmonic higher-order transversal mode components). Also, between the two boundaries, surface waves S1, S2, . . . of the non-harmonic higher-order transversal mode are generated between the two boundaries, as indicated by dotted lines. Since these surface waves are consistent in frequency and phase so that they will resonate to result in standing waves, the inventors found that the standing waves thus generated would be the cause of the susceptibility of the conventional SAW resonator to the spurious response due to the non-harmonic higher-order transversal mode.

Also, electrode fingers 3a, 3b at both side ends of the rectangle extend perpendicularly to the propagation direction of the surface acoustic waves, and function as reflecting surfaces for certain components of surface acoustic waves (components of the surface acoustic waves having a wave vector in the direction parallel with the direction of the surface acoustic wave propagation, i.e., non-harmonic higher-order longitudinal mode components). Thus, surface waves S3, S4, . . . of the non-harmonic higher-order longitudinal mode are generated between the two electrode fingers 3a, 3b at the two side ends, and become standing waves which consequently cause the resonance. It is thought that the standing waves thus generated are the cause of the susceptibility of the conventional SAW resonator to the spurious response due to the non-harmonic higher-order longitudinal mode.

The SAW device according to the present invention, on the other hand, is constructed such that the opposing bus bars extend in an inclined direction with respect to the direction of surface acoustic wave propagation, so that the wave motions, potentially causing the standing waves, differ in frequency or in phase, and are accordingly less prone to leading to the generation of standing waves. Stated another way, the SAW device according to the present invention is hardly susceptible to the resonance due to the non-harmonic higher-order modes, thereby making it possible to significantly reduce the spurious response.

DETAILED DESCRIPTION OF THE INVENTION

Embodiments of a SAW device according to the present invention will hereinafter be described in detail with reference to the accompanying drawings.

Figure 4A:
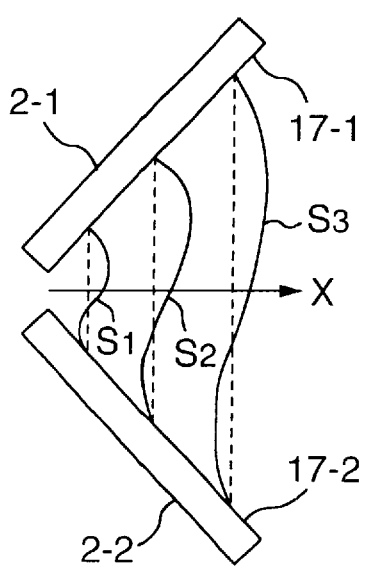
FIGS. 4A, 4B are diagrams for explaining the principles of a SAW device according to the present invention.
Figure 4B:
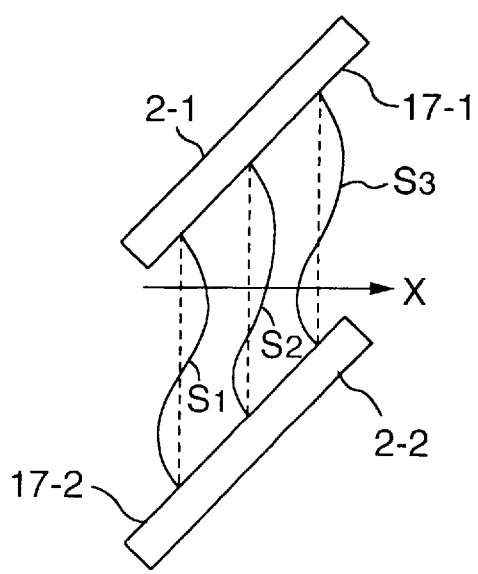

Prior to explaining embodiments of the present invention, the basic principles of the present invention will first be explained with reference to FIGS. 4A, 4B. Specifically, as illustrated in FIG. 4A, 4B, opposing bus bars 2-1, 2-2 and a grating region are arranged such that boundaries 17-1, 17-2 therebetween extend in directions which are inclined with respect to the direction x of surface acoustic wave propagation. In the example illustrated in FIG. 4A, the bus bars 2-1, 2-2 are not parallel with each other, in other words, the distance between the bus bars 2-1, 2-2 is not constant in the extending direction of the boundaries 17. This structure is less susceptible to the generation of standing waves because of a difference in frequency (FIG. 4A) or in phase (FIG. 4B) among surface waves S1–S3, which may cause the standing wave. Consequently, the SAW device of the present invention prevents the resonance due to the non-harmonic higher-order modes, thereby making it possible to significantly reduce the spurious response.

Figure 5:
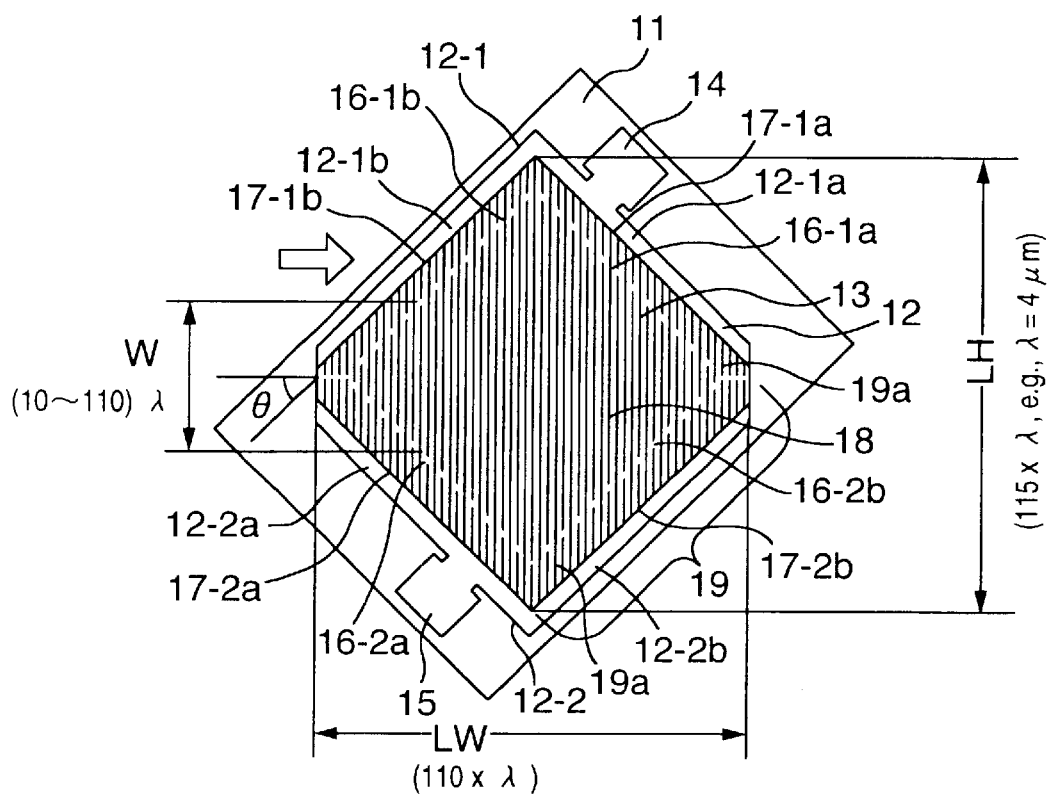
FIG. 5 is a top plan view illustrating the structure of a first embodiment of the SAW device according to the present invention.

FIG. 5 is a top plan view illustrating the structure of a first embodiment of the SAW device according to the present invention. As an example, the SAW device according to the present invention is implemented as a love-wave type SAW resonator which is fabricated by applying IDT electrodes made of gold or aluminum on a piezoelectric substrate made of rotated Y-cut X-propagation or rotated Y-cut Z'-propagation lithium niobate ($LiNbO_3$) which is used typically as piezoelectric substrates for SAWs where the direction of phase velocity of propagating surface acoustic waves matches the direction of the group velocity (a power flow angle is zero).

In FIG. 5, an interdigital transducer (IDT) is formed of a plurality of electrode fingers 13 which are arranged within an region defined by two bus bars 12-1, 12-2 on a planar surface of a piezoelectric substrate 11 in the following manner. Specifically, the bus bar 12-1 has two bus bar sides 12-1a, 12-1b continuously extending with a predetermined angle (preferably at 90 degrees) formed therebetween, while the bus bar 12-2 has two bus bar sides 12-2a, 12-2b continuously extending with the predetermined angle formed therebetween, respectively. These bus bar sides 12-1a, 12-1b, 12-2a, 12-2b form a rhomboid as a whole such that the bus bar sides 12-1a, 122a are positioned opposite to each other, while the bus bar sides 12-1b, 12-2b are likewise positioned opposite to each other. The first embodiment, therefore, corresponds to a combination of two interdigital transducers illustrated in FIG. 4A.

In addition, a cross region 18 of the plurality of electrode fingers 13 connected to the associated bus bars 12-1, 12-2 (the region surrounded by envelopes 16-1a, 16-1b, 16-2a, 16-2b in FIG. 5) is formed inside the bus bars 12-1, 12-2 such that the electrode cross region 18 defines a rhomboid similar to the rhomboid defined by the bus bars 12-1, 12-2. The electrode fingers connected to the bus bar 12-1 and the electrode fingers connected to the bus bar 12-2 are arranged alternatively in the electrode cross region 18. Here, the bus bar sides 12-1a, 12-1b, 12-2a, 12-2b and the envelopes 16-1a, 16-1b, 16-2a, 16-2b respectively corresponding (opposite) thereto are arranged in parallel with each other and spaced by a constant distance.

Stated another way, the cross width W of the electrode cross region 18 is the largest at the center, and becomes gradually smaller toward both the left and right side ends in FIG. 5. As is appreciated, the weighting in accordance with the apodization technique is applied to the SAW device of the first embodiment. The angles formed by the extending directions of boundaries 17-1a, 17-1b, 17-2a, 17-2b defined by the bus bar sides 12-1a, 12-1b, 12-2a, 12-2b of the interdigital transducers and the group velocity direction (the transmission direction: the direction indicated by the arrow) of acoustic surface waves excited by the two interdigital transducers are set at ±45 degrees.

In the case of an embodiment for 800 MHz, for example, the electrode pitch λ is set at 4 $\mu$m, the cross width W is set in a range of (0~110)×λ, LH is set at 115 ×λ and LW is set at 110×λ.

The two bus bars 12-1, 12-2 include input/output terminals 14, 15, respectively. Any of the four sides of the rectangular piezoelectric substrate 11 does not extend in the orthogonal or parallel direction to the group velocity direction, but is at an angle of 45 degrees to the group velocity direction.

In FIG. 5, the envelopes of the cross region 18 of the electrode fingers 13 form a rhomboid to obviate standing waves which are thought to be the cause of the spurious response due to the non-harmonic higher-order longitudinal and transversal modes. In addition, since a surface wave waveguide (grating region 19) is also in the shape of a rhomboid, this further suppresses the spurious response.

Figure 6:
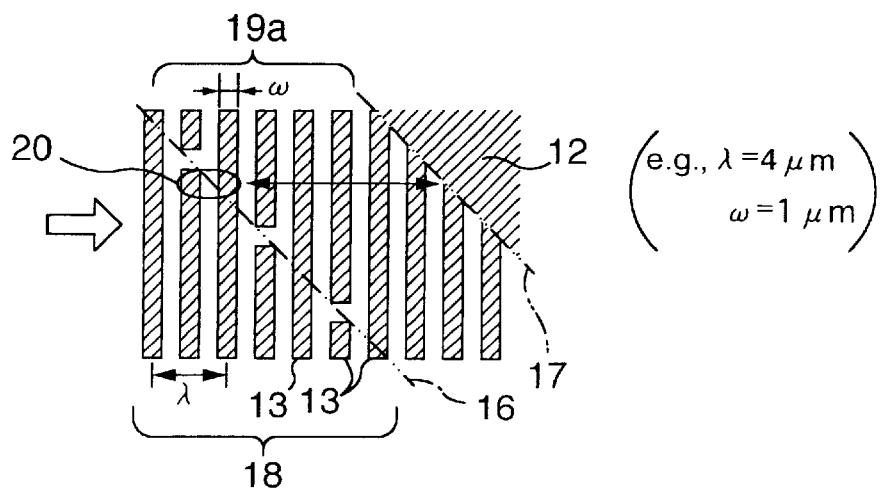
FIG. 6 is a partially enlarged view of the SAW device illustrated in FIG. 5.

FIG. 6 illustrates in enlarged view a portion near an envelope in the embodiment described above. A grating region 19a between an envelope 16 of the cross region 18 of the electrode fingers 13 and a bus bar 12 functions as a reflector for surface acoustic waves. A surface acoustic wave excited by a pair of electrode fingers near the envelope 16 (for example, a portion 20 surrounded by an ellipse in FIG. 6) encounters, for example, five electrode fingers before it reaches the bus bar 12. Since these electrode fingers function as a reflector, the example of the electrode arrangement illustrated in FIG. 5 exhibits a characteristic equivalent to that of an IDT having five reflectors in terms of the electric characteristics excluding the spurious response. In FIG. 6, a line 17 indicates the boundary between the bus bar 12 and the grating region 19.

In the case of the aforesaid embodiment for 800 MHz, for example, the electrode pitch λ is set at 4 $\mu$m, and the electrode finger width ω is set at 1 $\mu$m.

Figure 1:
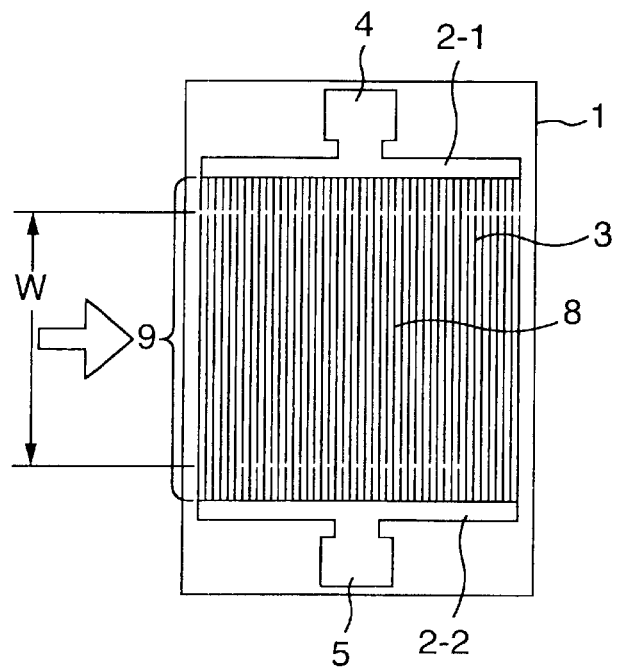
FIG. 1 is a top plan view illustrating the structure of an example of a conventional SAW device.
Figure 2:
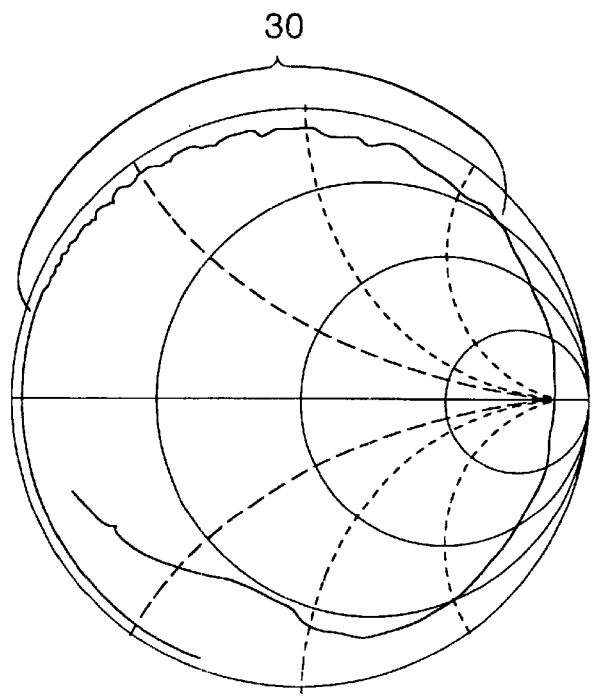
FIG. 2 is a Smith chart representing the impedance characteristic of the SAW device of FIG. 1.
Figure 3:
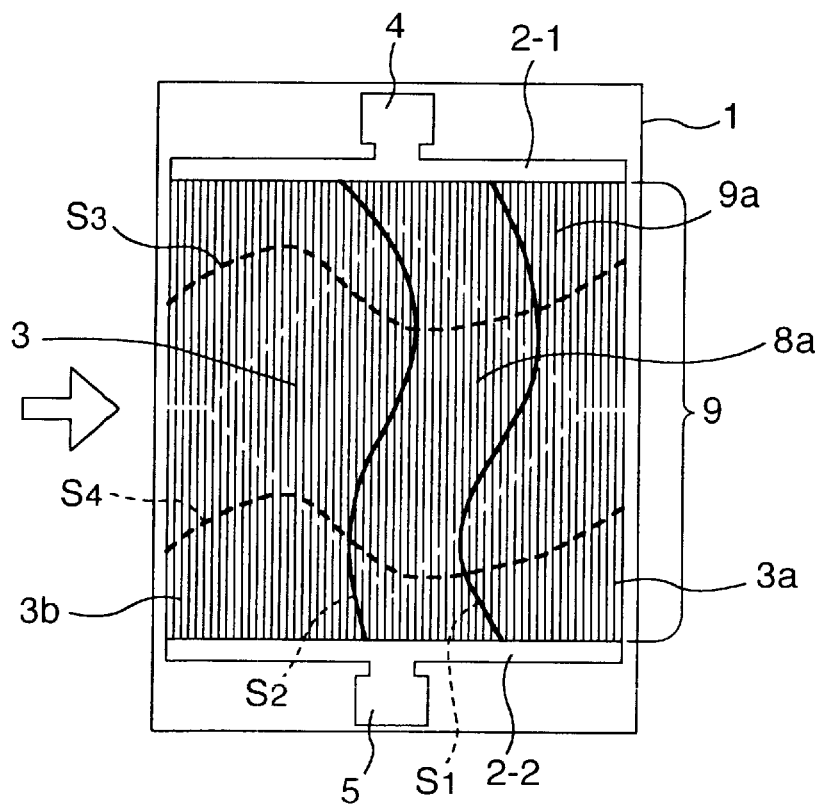
FIG. 3 is a top plan view illustrating an example of a conventional SAW device which has a cross region weighted in accordance with the apodization technique;.

Since the SAW device of the first embodiment has the grating region 19, the area of which is approximately one half in comparison with the conventional SAW resonator illustrated in FIG. 3, the area of the piezoelectric substrate 11 and hence the chip area are also reduced by approximately 38 percent. Generally, the number of resonators possibly produced from one wafer made of lithium niobate or the like is reciprocally proportional to the chip area of the piezoelectric substrate 11. Accordingly, the first embodiment can accomplish a reduced spurious response, higher mass-productivity, a lower cost, and a smaller size of the device which is an advantage of the SAW resonator.

While the foregoing embodiment has been described for an example in which the angle formed by the bus bar 12 and the group velocity direction is at the most desirable angle of 45 degrees, the present invention is not limited to this particular angle. The present inventors have fabricated and evaluated prototype resonators with the ratio of the height (LH in FIG. 5) to the width (LW in FIG. 5) of the grating region 19 (LH/LW) set at 1/4 (the angle formed between the bus bar 12 and the group velocity direction (θ in FIG. 5) is 14 degrees: tan 14°=1/4); 1/3 (tan 18°); 1/2 (tan 27°); 1/1 (tan 45°); 2/1 (tan 63°); 3/1 (tan 72°0); and 4/1 (tan 76°). The evaluation results revealed that the resonator with LH/LW=1/4 was insufficient for suppressing the spurious response due to the non-harmonic higher-order transversal mode, while the resonator with LH/LW=4/1 was insufficient for suppressing the spurious response due to the non-harmonic higher-order longitudinal mode. The evaluation results also revealed that the resonators with LH/LW=1/3 (corresponding to θ=18°) to LH/LW=3 (corresponding to θ=72°) were able to suppress simultaneously the spurious responses due to the non-harmonic higher-order transversal and longitudinal modes.

Figure 7:
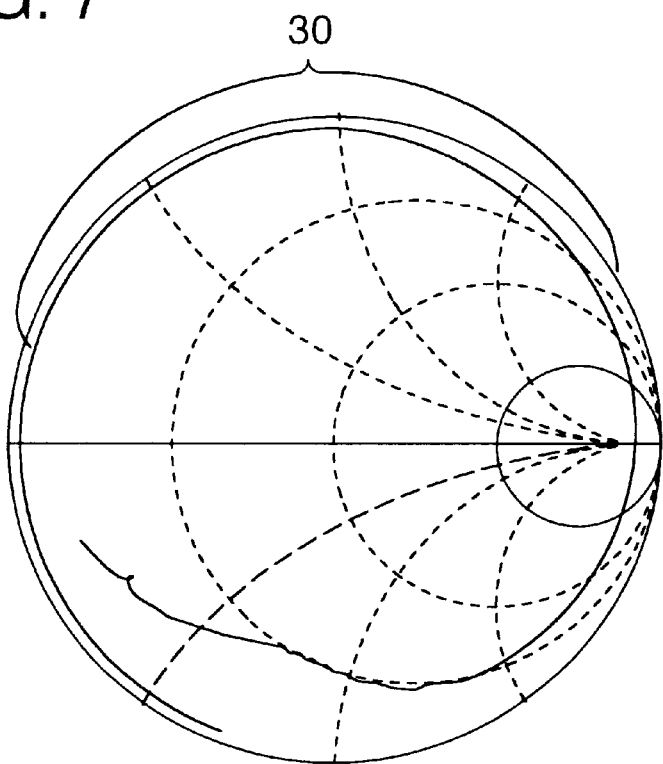
FIGS. 7, 8 are Smith charts respectively representing the impedance characteristic of the SAW device of FIG. 5.
Figure 8:
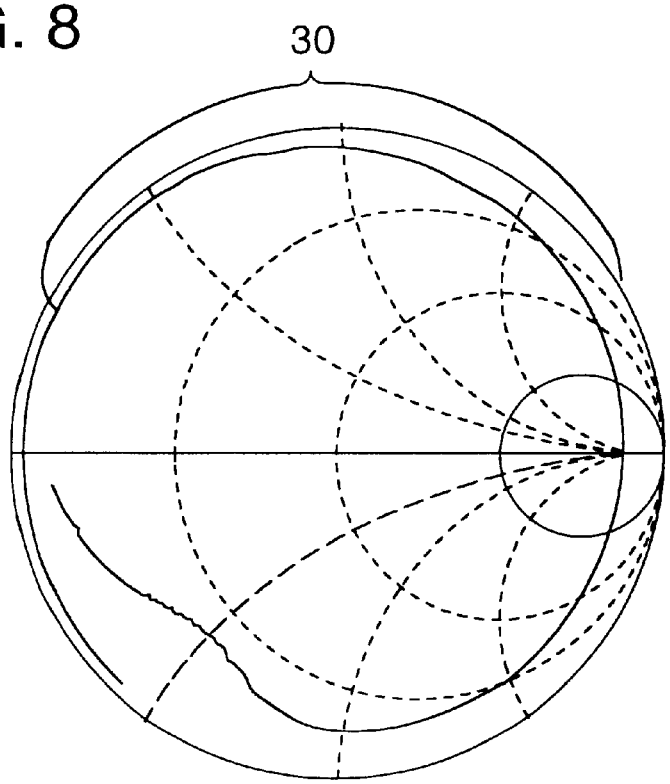

FIGS. 7, 8 are Smith charts respectively illustrating the impedance characteristics of the SAW device of FIG. 5, where FIG. 7 illustrates the impedance characteristic of the SAW device with LH/LW=1 (θ=45°), and FIG. 8 illustrates the impedance characteristic of the SAW device with LH/LW=1/3 (θ=30°). It can be seen in FIG. 7 that a wavy line is completely eliminated in a region 30, demonstrating that no spurious response occurs due to the non-harmonic higher-order transversal and longitudinal modes. In FIG. 8, on the other hand, a wavy line is found slightly in the region 30, demonstrating that a slight spurious response occurs due to the non-harmonic higher-order transversal and longitudinal modes, which however is low enough to determine that the spurious is sufficiently suppressed.

It can be concluded from the foregoing that the spurious suppressing effect is generally produced maximally when the angle θ formed by the bus bar and the group velocity direction is at 45 degrees, and fairy well when the angle θ lies in a range of 45±27 degrees.

While the foregoing embodiment has shown, as an example, the cross region 18 in the shape of a rhomboid, the present invention is not limited to this particular shape, but may employ a cross region which is weighted as a circle, a cosine waveform, a cosine squared waveform, or any other functional waveform.

Figure 9:
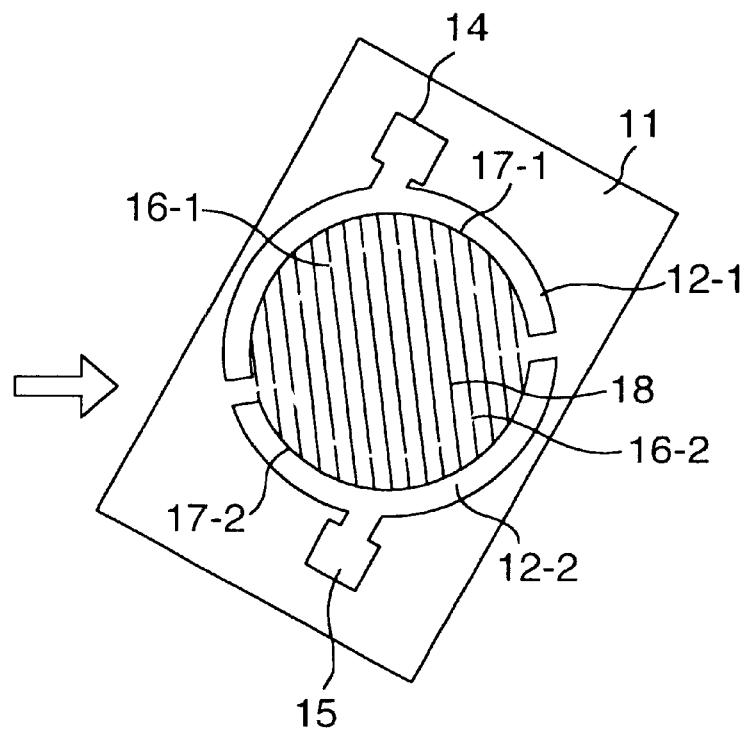
FIG. 9 is a top plan view illustrating the structure of an example of a modification to the first embodiment of the SAW device according to the present invention.

FIG. 9 is a top plan view illustrating the structure of an example of a modification to the first embodiment of the SAW device according to the present invention which employs a cross region 18 in the shape of a circle, in which case a bus bar 12-1 and an envelope 161, and a bus bar 12-2 and an envelope 16-2 are arranged such that they are spaced by a constant distance.

Figure 10:
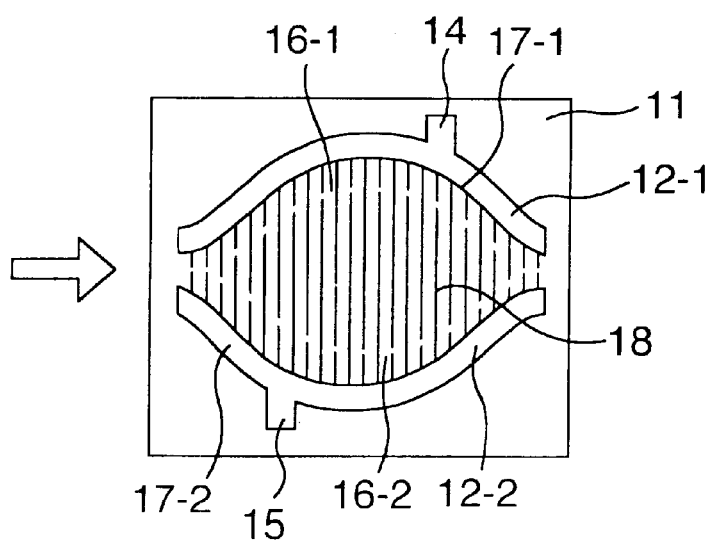
FIG. 10 is a top plan view illustrating the structure of another example of a modification to the first embodiment of the SAW device according to the present invention.

FIG. 10 is a top plan view illustrating the structure of another example of a modification to the first embodiment of the SAW device according to the present invention which employs a cross region 18 shaped conforming to a cosine waveform, in which case a bus bar 12-1 and an envelope 16-1, and a bus bar 12-2 and an envelope 16-2 are likewise arranged such that they are spaced by a constant distance.

As described above, the SAW device in the example of FIG. 5 is constructed such that the extending directions of the boundaries 17-1a, 17-1b, 17-2a, 17-2b between the bus bar sides 2-1a, 2-1b, 2-2a, 2-2b and the grating region 19 are each inclined at an angle in a range of approximately 45±27 degrees with respect to the propagation direction of surface acoustic waves (the direction indicated by the arrow in FIG. 5).

In the respective examples of FIGS. 9, 10, in turn, the SAW devices are constructed such that significant portions of the boundaries 17 (preferably, approximately one half or more of the entire length of each boundary) between the bus bars 2-1, 2-2 and the rating region are each inclined at an angle in a range of approximately 45±27 degrees with respect to the direction of surface acoustic wave propagation (the directions indicated by the arrows in FIG. 9, 10, respectively). With such arrangements, it is possible to sufficiently suppress the spurious response due to the non-harmonic higher-order transversal and longitudinal modes.

Figure 11:
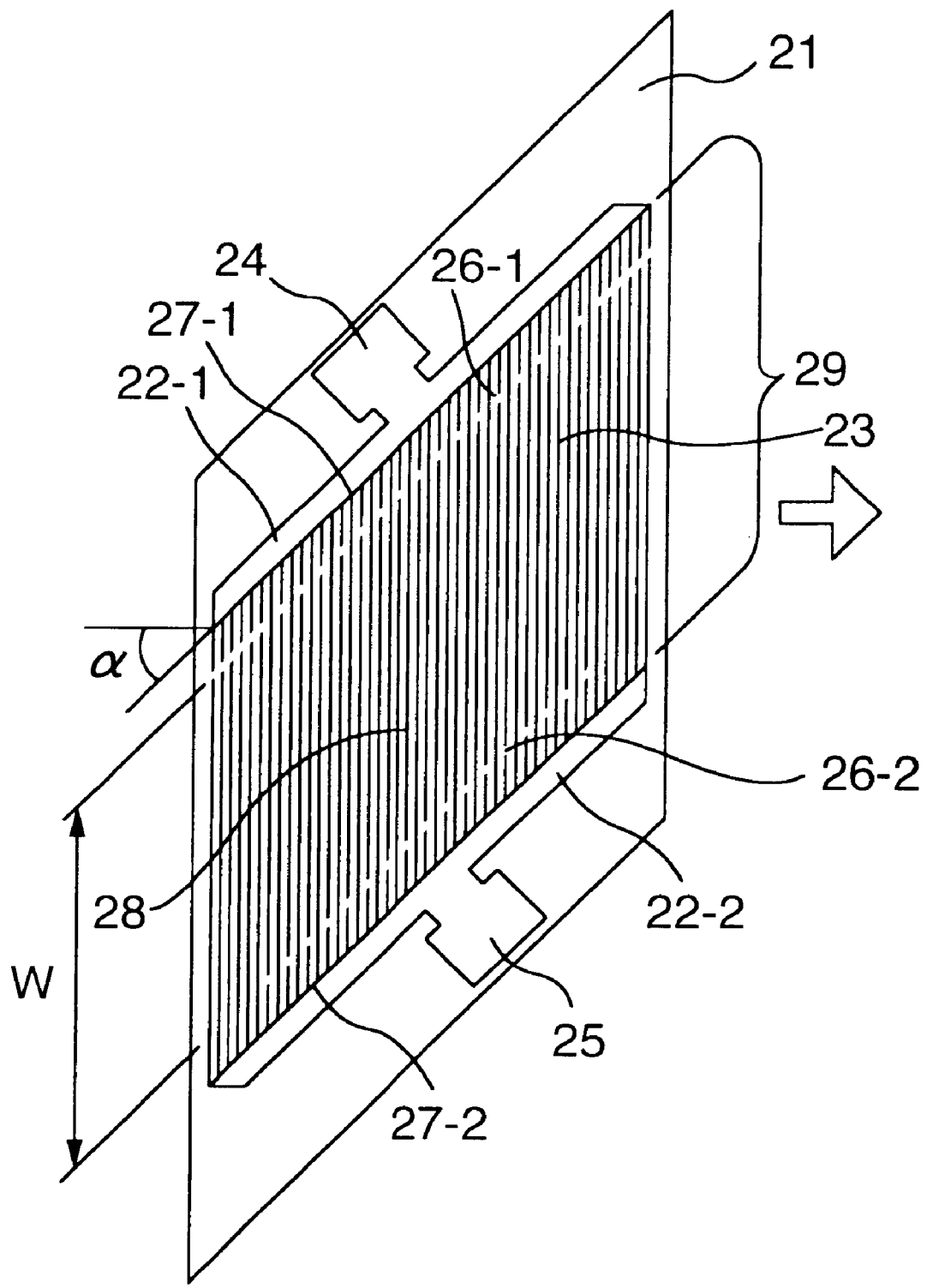
FIG. 11 is a top plan view illustrating the structure of a second embodiment of the SAW device according to the present invention.

FIG. 11 is a top plan view illustrating the structure of a second embodiment of the SAW device according to the present invention which employs the interdigital transducers previously shown in FIG. 4B.

As illustrated in FIG. 11, two opposing bus bars 22-1, 22-2 of interdigital transducers (IDT) are directed in parallel with each other, and the extending direction of boundaries 27-1, 27-2 between each of the bus bars 22-1, 22-2 forms an angle α, which may be approximately 45 degrees, with the group velocity direction of surface acoustic waves (the direction indicated by the arrow). Electrode fingers 23 of the interdigital transducers are formed orthogonal to the group velocity direction of surface acoustic waves (the direction indicated by the arrow). Also, the bus bars 22-1, 22-2 are formed in parallel with and opposite to envelopes 26-1, 26-2, respectively, of a cross region 28 of the electrode fingers with a constant distance spaced therebetween. Along any side of a quadrilateral piezoelectric substrate 21, the extending direction of the boundaries 27-1, 27-2 does not match the group velocity direction, so that the two parallel sides of the bus bars 22-1, 22-2 and two parallel sides of the electrode fingers 23 form a quadrilateral. Since the group velocity direction of surface acoustic waves excited by the cross region 28 of the electrode fingers 23 is defined in a direction perpendicular to the electrode fingers 23 (the direction indicated by the arrow in FIG. 11), the extending direction of the boundaries 27-1, 27-2 is arranged at an angle of approximately 45 degrees from the group velocity direction.

In FIG. 11, while the width W of the cross region 28 of the electrode fingers 23 in the IDTs is entirely consistent along the extending direction of the boundaries 27-1, 27-2, the envelopes 26-1, 26-2 of the cross region 28 of the electrode fingers 23 form a parallelogram which has four internal angles not equal to 90 degrees, respectively, thereby suppressing the spurious response due to the non-harmonic higher-order longitudinal and transversal modes. In addition, a surface acoustic wave waveguide (grating region) 29 is also in the shape of a parallelogram similar to the cross region 28, thus more powerfully suppressing the spurious response.

When comparing the second embodiment with the conventional SAW resonator illustrated in FIG. 3, the grating region 29 has an area which is approximately one half, so that the chip area can also be reduced by approximately 28 percent.

When the power flow angle is not zero, the group velocity direction of surface acoustic waves excited by the cross region 28 of the electrode fingers 23 deviates from the direction perpendicular to the electrode fingers 23. In the case of FIG. 11, similar effects to those of the first embodiment can be achieved by limiting the extending direction of the boundaries 27-1, 27-2 within an angular range of 45±27 degrees from the group velocity direction of the surface acoustic waves, as is the case of the first embodiment.

While the foregoing embodiments have been described in connection with SAW resonators to which the SAW device according to the present invention is applied, the present invention is not limited to these particular embodiments. Specifically, the SAW device of the present invention may be applied to SAW devices which employ interdigital transducers, such as surface acoustic wave filters, convolvers, and so on, thereby producing similar effects to the foregoing.

Also, the present invention is not limited to the application to a Love-wave type SAW resonator. It is apparent that the present invention can also be applied to a variety of resonators employing surface acoustic waves (for example, resonators employing Rayleigh waves, pseudo surface acoustic waves, and so on) irrespective of the magnitude of the electro-mechanical coupling coefficient $K^2$ to produce an effect of more powerfully suppressing the spurious response.

While the respective embodiments have employed lithium niobate as the piezoelectric substrate, the present invention is not limited to this particular material, but may also use, for example, lithium tantalate, quartz, potassium niobate, langasite, and so on, in which case similar effects can be produced.

Since a Love-wave type SAW resonator has a significantly large electromechanical coupling coefficient $K^2$ of surface acoustic waves on the order of 30 percent, the reflection coefficient per electrode finger is extremely large. Thus, when such a resonator is formed of a relatively small number of pairs of IDTs, for example, several tens of pairs of IDTs, the resonator may have approximately five to ten electrode fingers, which function as the reflector, for producing sufficient effects.

It should be noted however that while the number of electrode fingers functioning as the reflector is not limited to a range of five to ten but may be any number more than ten, an extremely large number of electrode fingers would result in a larger shape of the overall electrodes and hence a large chip area. Actually, the number of electrode fingers functioning as the reflector should be set such that a maximum effect can be produced with a minimum chip area. Showing a specific example of a Love-wave type SAW resonator constructed according to the present invention, which employs 15°-rotated Y-cut lithium niobate for a piezoelectric substrate and aluminum for electrodes (wavelength converted film thickness is 0.125), sufficient effects were observed by selecting the number of IDT paris to be 110 and the number of electrode fingers functioning as a reflector to be approximately ten.

As described above, according to the present invention, it is possible to suppress the occurrence of standing waves which are thought to be the cause of the spurious response due to the non-harmonic higher-order longitudinal and transversal modes by changing the arrangement of the bus bars associated with the interdigital transducer. In addition, the chip area can be reduced. The reduced chip area makes it possible to provide a low cost SAW device which is superior in massproductivity, and reduced in size and weight.

What is claimed is:

1. A surface acoustic wave device comprising:
   a piezoelectric substrate; and
   an interdigital transducer formed on a planar surface of said piezoelectric substrate, said interdigital transducer having first and second bus bars, and a first and a second plurality of rectilinear and mutually parallel electrode fingers connected to said first and second bus bars respectively
   wherein said first and second plurality of electrode fingers of said interdigital transducer have an electrode cross region in which said first and second plurality of electrode fingers are arranged alternatively; and
   each of boundary lines between said first and second bus bars and a grating region composed of said first and second plurality of electrode fingers is arranged such that each of said boundary lines is not substantially parallel, with respect to a transmission direction of surface acoustic waves excited by said interdigital transducer.

2. A surface acoustic wave device according to claim 1, wherein said each boundary lines is arranged such that the extending direction of said boundary lines is at an angle in a range of 45±27 degrees, with respect to the group velocity direction of the surface acoustic waves excited by said interdigital transducer.

3. A surface acoustic wave device according to claim 2, wherein said piezoelectric substrate is in the shape of a parallelogram, said parallelogram having sides, each of which extends in a direction non-parallel with the transmission direction of the surface acoustic waves excited by said interdigital transducer.

4. A surface acoustic wave device according to claim 1, wherein said each boundary lines is arranged such that the extending direction of said boundary lines is not substantially parallel, in one half or more of the overall length thereof, with the transmission direction of surface acoustic waves excited by said interdigital transducer.

5. A surface acoustic wave device according to claim 1, wherein said piezoelectric substrate is formed of lithium niobate.

6. A surface acoustic wave device, comprising:
   a piezoelectric substrate; and
   an interdigital transducer formed on a planar surface of said piezoelectric substrate, said interdigital transducer having first and second bus bars, a first plurality of electrode fingers connected to said first bus bar, and a second plurality of electrode fingers connected to said second bus bar,
   wherein said first and second plurality of electrode fingers of said interdigital transducer have an electrode cross region in which said first and second plurality of electrode fingers are arranged alternatively; and
   wherein each of boundary lines between said first and second bus bars and a grating region of said first and second plurality of electrode fingers is arranged such that said boundary line is not substantially parallel, with a transmission direction of surface acoustic waves excited by said interdigital transducer,
   wherein said cross region is weighted in accordance with an apodization technique.

7. A surface acoustic wave device, comprising:
   a piezoelectric substrate; and
   an interdigital transducer formed on a planar surface of said piezoelectric substrate, said interdigital transducer having first and second bus bars, a first plurality of electrode fingers connected to said first bus bar, and a second plurality of electrode fingers connected to said second bus bar,
   wherein said first and second plurality of electrode fingers of said interdigital transducer have an electrode cross region in which said first and second plurality of electrode fingers are arranged alternatively,
   wherein each of boundary lines between said first and second bus bars and a grating region of said first and second plurality of electrode fingers is arranged such that said boundary line is not substantially parallel, with a transmission direction of surface acoustic waves excited by said interdigital transducer, and
   wherein said each boundary lines is arranged such that the extending direction of said boundary is at an angle in a range of 45±27 degrees, with respect to the group velocity direction of the surface acoustic waves excited by said interdigital transducer,
   wherein said cross region has envelopes in the shape of a rhomboid, and said each boundary is parallel with a corresponding envelope.

8. A surface acoustic wave device according to claim 7, wherein said piezoelectric substrate is in the shape of a quadrilateral, and said each boundary line is parallel with a corresponding side of said piezoelectric substrate.

9. A surface acoustic wave device, comprising:
   a piezoelectric substrate; and
   an interdigital transducer formed on a planar surface of said piezoelectric substrate, said interdigital transducer having first and second bus bars, a first plurality of electrode fingers connected to said first bus bar, and a second plurality of electrode fingers connected to said second bus bar, wherein said first and second plurality of electrode fingers of said interdigital transducer have an electrode cross region in which said first and second plurality of electrode fingers are arranged alternatively, wherein each of boundary lines between said first and second bus bars and a grating region of said first and second plurality of electrode fingers is arranged such that said boundary line is not substantially parallel, with a transmission direction of surface acoustic waves excited by said interdigital transducer, and wherein said each boundary lines is arranged such that the extending direction of said boundary is at an angle in a range of 45±27 degrees, with respect to the group velocity direction of the surface acoustic waves excited by said interdigital transducer, wherein said piezoelectric substrate is in the shape of a parallelogram, said parallelogram having sides, each of which extends in a direction non-parallel with the transmission direction of the surface acoustic waves excited by said interdigital transducer, wherein said grating region of said first and second electrode fingers is in the shape of a parallelogram.

10. A surface acoustic wave device comprising:

a piezoelectric substrate; and an interdigital transducer formed on a planar surface of said piezoelectric substrate, and having first and second bus bars, and a first and a second plurality of rectilinear and mutually parallel electrode fingers connected to said first and second bus bars respectively wherein said first and second plurality of electrode finger of said interdigital transducer have a cross region in which said first and second plurality of electrode fingers cross with each other, and wherein the distance between said first and second bus bars along said first and second plurality of electrode fingers varies along a group velocity direction of the surface acoustic waves excited by said interdigital transducer.

11. A surface acoustic wave device according to claim 10, wherein each of boundary lines provided between said first and second bus bars and a grating region compound of said first and second plurality of electrode fingers is arranged such that the extending direction of said boundary is at an angle in a range of 45±27 degrees, with respect to the group velocity direction of the surface acoustic waves excited by said interdigital transducer.

12. A surface acoustic wave device according to claim 10, wherein said each boundary line provided between said first and second bus bars and a grating region of said first and second plurality of electrode fingers is arranged such that the extending direction of said boundary line is not substantially parallel, in one half or more of the overall length thereof, with the transmission direction of surface acoustic waves excited by said interdigital transducer.

13. A surface acoustic wave device according to claim 10, wherein said piezoelectric substrate is formed of lithium niobate.

14. A surface acoustic wave device, comprising:

a piezoelectric substrate; and an interdigital transducer formed on a planar surface of said piezoelectric substrate, and having first and second bus bars, a first plurality of electrode fingers connected to said first bus bar, and a second plurality of electrode fingers connected to said second bus bar, wherein said first and second plurality of electrode fingers of said interdigital transducer have a cross region in which said first and second plurality of electrode fingers cross with each other, wherein the distance between said first and second bus bars along said first and second plurality of electrode fingers varies along a group velocity direction of the surface acoustic waves excited by said interdigital transducer, and wherein said cross region is weighted in accordance with an apodization technique.

15. A surface acoustic wave device according to claim 14, wherein a region surrounded by said first and second bus bars has same shape as said cross region weighted in accordance with an apodization technique.

16. A surface acoustic wave device, comprising:

a piezoelectric substrate; and an interdigital transducer formed on a planar surface of said piezoelectric substrate, and having first and second bus bars, a first plurality of electrode fingers connected to said first bus bar, and a second plurality of electrode fingers connected to said second bus bar, wherein said first and second plurality of electrode fingers of said interdigital transducer have a cross region in which said first and second plurality of electrode fingers cross with each other, wherein the distance between said first and second bus bars along said first and second plurality of electrode fingers varies along a group velocity direction of the surface acoustic waves excited by said interdigital transducer, and wherein each of boundary lines provided between said first and second bus bars and a grating region composed of said first and second plurality of electrode fingers is arranged such that the extending direction of said boundary line is at an angle in a range of 45±27 degrees, with respect to the group velocity direction of the surface acoustic waves excited by said interdigital transducer, wherein said cross region has envelopes in the shape of a rhomboid, and said each boundary line is parallel with a corresponding envelope.

17. A surface acoustic wave device according to claim 16, wherein said piezoelectric substrate is in the shape of a quadrilateral, and said each boundary line is parallel with a corresponding side of said piezoelectric substrate.

18. A surface acoustic wave device, comprising:

a piezoelectric substrate; and an interdigital transducer formed on a planar surface of said piezoelectric substrate, and having first and second bus bars, a first plurality of electrode fingers connected to said first bus bar, and a second plurality of electrode fingers connected to said second bus bard, wherein said first and second plurality of electrode fingers of said interdigital transducer have a cross region in which said first and second plurality of electrode fingers cross with each other, wherein the distance between said first and second bus bars along said first and second plurality of electrode fingers varies along a group velocity direction of the surface acoustic waves excited by said interdigital transducer, and wherein each of boundary lines provided between said first and second bus bars and a grating region composed of said first and second plurality of electrode fingers is arranged such that the extending direction of said boundary line is at an angle in a range of 45±27 degrees, with respect to the group velocity direction of the surface acoustic waves excited by said interdigital transducer, wherein said piezoelectric substrate is in the shape of a parallelogram, said parallelogram having sides, each of which extends in a direction non-parallel with the transmission direction of the surface acoustic waves excited by said interdigital transducer.

19. A surface acoustic wave device according to claim 18, wherein said grating region of said first and second electrode fingers is in the shape of a parallelogram.

20. A surface acoustic wave device comprising:

a piezoelectric substrate; and an interdigital transducer formed on a planar surface of said piezoelectric substrate, said interdigital transducer having first and second bus bars, and a first and a second plurality of rectilinear and mutually parallel electrode fingers connected to said first and second bus bars respectively wherein said first and second plurality of electrode fingers of said interdigital transducer have an electrode cross region in which said first and second plurality of electrode fingers are arranged alternatively, and wherein each of said first and second bus bars is not substantially parallel with respect to a transmission direction of surface acoustic waves excited by said interdigital transducer.

21. A surface acoustic wave device comprising:

a piezoelectric substrate; and an interdigital transducer formed on a planar surface of said piezoelectric substrate, said interdigital transducer having first and second bus bars, a first and a second plurality of rectilinear and mutually parallel electrode fingers connected to said first ad second bus bars, respectively, wherein said first and second plurality of electrode fingers of said interdigital transducer have an electrode cross region in which said first and second plurality of electrode fingers are arranged alternatively, and wherein each of said first and second bus bars is substantially at an angle with respect to a transmission direction of surface acoustic waves excited by said interdigital transducer.

* * * * *